United States Patent [19]

Rokos et al.

[11] Patent Number: 4,560,959
[45] Date of Patent: Dec. 24, 1985

[54] TEMPERATURE CONTROLLED CRYSTAL OSCILLATOR ARRANGEMENT

[75] Inventors: George H. S. Rokos, Bishops Stortford; James S. Wilson, Harlow, both of England

[73] Assignee: Standard Telephones and Cables Public Limited Company, London, England

[21] Appl. No.: 495,858

[22] Filed: May 18, 1983

[30] Foreign Application Priority Data

May 18, 1982 [GB] United Kingdom ............... 8214417

[51] Int. Cl.⁴ ............................................ H03L 1/02
[52] U.S. Cl. .................................... 331/176; 331/66; 331/116 R
[58] Field of Search ............... 331/66, 176, 116 R, 331/158; 307/491

[56] References Cited

U.S. PATENT DOCUMENTS

| | | | |
|---|---|---|---|
| 3,454,903 | 7/1969 | Page | 331/176 X |
| 3,821,665 | 6/1974 | Irwin et al. | 331/116 R |
| 4,051,446 | 9/1977 | Owaki | 331/176 X |
| 4,107,629 | 8/1978 | Stone, Jr. | 331/116 R |

FOREIGN PATENT DOCUMENTS

| | | |
|---|---|---|
| 2458942 | 1/1981 | France . |
| 1352808 | 5/1974 | United Kingdom . |
| 2055521 | 3/1981 | United Kingdom . |

OTHER PUBLICATIONS

Johnson, D. E., "Introduction to Filter Theory" [Book] ©1976, Publisher: Prentice-Hall, pp. 48-51.
Cherry Semiconductor, Genesis TM "Linear Semi--Custom Programs".
Exar Integrated Systems Inc., "Linear and Digital Semi-Custom IC Design Programs", Nov. 1980.

Primary Examiner—Eugene R. LaRoche
Assistant Examiner—Robert J. Pascal
Attorney, Agent, or Firm—Kerkam, Stowell, Kondracki & Clarke

[57] ABSTRACT

A temperature compensated crystal oscillator in which the base emitter voltage of transistors in an integrated circuit is used to provide substantially linearly temperature sensitive outputs which are employed to generate a series of polynomial functions of Chebyshev-like form which are summed and used to control a varicap diode in the oscillator feedback path.

15 Claims, 11 Drawing Figures

TEMPERATURE CONTROLLED CRYSTAL OSCILLATOR ARRANGEMENT

BACKGROUND OF THE INVENTION

The present invention relates generally to oscillators and more particularly to temperature compensated crystal oscillator arrangements.

Crystal oscillators are widely employed in electronic equipment, usually in situations where a precise frequency of oscillation is required. However, the natural resonant frequency of a crystal is a function of temperature, and for some applications the operating temperature range is so great having regard to the frequency stability requirements that special measures have to be taken to reduce the effects of temperature variations upon the operating frequency of the oscillator. This reduction can be achieved by maintaining the crystal at a constant temperature in a temperature controlled oven, but this requires a relatively large amount of space and involves the consumption of a relatively large amount of power. This is the approach used in the oven controlled crystal oscillator (OCXO). In a temperature compensated crystal oscillator (TCXO) an alternative approach to obtaining the required reduction in temperature sensitivity is obtained by the use of a variable reactance element in the feedback path of the oscillator to 'pull' the forced resonant frequency of the oscillator in such a way as to compensate for the changes that would otherwise result from the changes in the natural resonant frequency of the crystal. Typically the variable reactance element of a TCXO is a varactor diode whose reactance is controlled by altering the d.c. voltage applied across its terminals. Various methods have been proposed for generating the requisite compensation voltage for the varactor diode, but to provide a reasonable stability over the temperature range from −40° C. to +85° C. the approach most commonly used to date is to provide a ladder network of three thermistors and five resistors. The values of the components in this latter are chosen having regard to the particular temperature characteristic exhibited by the uncompensated crystal, and this varies from oscillator to oscillator because the variations between nominally identical crystals prove to be quite significant. As a result, compensation with this form of ladder network typically requires the selection of appropriate values of resistors from three decades of 1% accuracy E 96 series resistors (resistors having 96 perferred values per decade). Since such highly precise resistors are often expensive, the cost of such known compensation network is considerable.

SUMMARY OF THE INVENTION

Accordingly, it is a general object of the present invention to avoid the disadvantages of the prior art.

More particularly, it is an object of the present invention to provide an oscillator arrangement of the type here under consideration, which does not possess the drawbacks of the conventional oscillator arrangements of this kind.

Still another object of the present invention is so to construct the oscillator arrangement of the above type as to make the oscillating frequency thereof virtually independent of temperature within a relatively wide temperature range.

It is yet another object of the present invention so to design the oscillator arrangement as to be able to use lower accuracy resistors than heretofore, without adverse impact on the accuracy of the oscillating frequency of the oscillator arrangement.

A concomitant object of the present invention is to develop an oscillating arrangement of the above type which is simple in construction, inexpensive to manufacture, especially by resorting to integrated circuit technology, and reliable in operation nevertheless.

In pursuance to these objects and others which will become apparent hereafter, one feature of the present invention resides in a temperature compensated crystal oscillator arrangement which comprises a crystal oscillator circuit including an oscillator crystal and having a frequency selective positive feedback path incorporating a frequency pulling control element; and a temperature sensitive compensation circuit so connected to the feedback path as to drive the control element, the compensation circuit including temperature sensing means operative for issuing an electrical output signal that is a monotonically varying function of temperature, power series function generator means connected to the temperature sensing means to receive the output signal therefrom and operative for generating a series of outputs that are polynomial functions of the output signal of orders that increase from output to output from zero to the number of outputs less one, summing amplifier means having a plurality of inputs each receiving one of the outputs of the power series function generator means and operative for providing an output signal that is a weighted sum of the outputs of the power series function generator means, and means for applying the output of the summing amplifier means to the feedback path so as to drive the control element.

BRIEF DESCRIPTION OF THE DRAWING

Above-mentioned and other features and objects of this invention will become more apparent by reference to the following description taken in conjunction with the accompanying drawing, in which.

DETAILED DESCRIPTION OF THE PREFERRED EMBODIMENT

Figure 1:
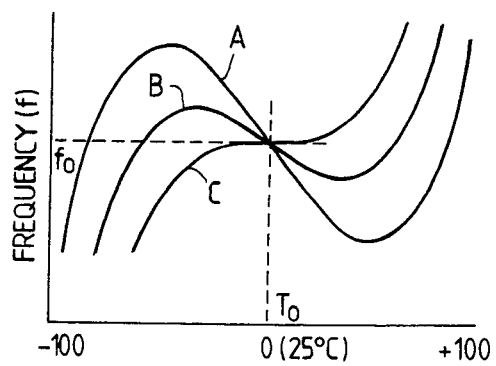
FIG. 1 is a graphic representation of the variation in resonant frequency of typical AT-cut quartz crystals cut at different angles as a function of temperature.

Referring now to the drawing in detail, and first to FIG. 1 thereof, it may be seen that it depicts the frequency temperature characteristics of typical AT-cut crystals of the kind frequently used in crystal oscillators, in the form of curves A, B and C. These curves are predominantly cubic, and the slopes at the point of inflection, which typically occurs at about 25° C., depend upon the angle of the cut.

Figure 2:
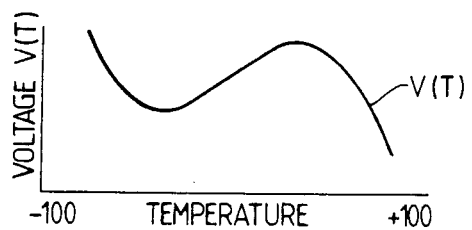
FIG. 2 is a graphic representation of the variation in magnitude of the required compensating voltage of a temperature compensated crystal oscillator as a function of temperature.

The compensating voltage is required to have a voltage/temperature characteristic V(T) having the general form depicted in FIG. 2 which is substantially a mirror image of the frequency/temperature characteristic of the particular crystal being compensated. This characteristic curve V(T) of FIG. 2 can be synthesized using the Weierstrass theorem by a power series of the form $$V(T) = A_0 + A_1(T-T_0) + A_2(T-T_0)^2 + A_3(T-T_0)^3 + \ldots + A_n(T-T_0)^n$$

where

V(T) is the required compensating voltage
T is the working temperature
$T_0$ is the inflection temperature, and $A_0, A_1, A_2$ etc. are the summing coefficients.

The error between V(T) and the required compensating voltage is in principle dependent upon the number of terms included in the power series. In practice it will also depend upon the precision with which the required summing coefficients can be realized. For this particular application, the dominant summing coefficients are those of the linear and cubic terms, and so in general it will not be necessary to use more than the first four terms of the series.

Having regard to the effects of errors, it is preferred not to generate the terms $(T-T_0)^n$ directly, but instead to generate Chebyshev-like polynomials. Normalized Chebyshev polynomials have the useful property that the excursion over the temperature range of interest is minimized, and this reduces the effects of errors in their coefficients. Also, by choosing the appropriate angle of cut for the crystal to provide minimum excursion of the natural resonant frequency of the crystal over the required temperature range, V(T) comes close to the third order Chebyshev polynomial $C_3(X) = 4x^3 - 3x$ (where $x = T - T_0$). Cubic, and to a lesser extent, linear, terms are particularly significant under these circumstances, and so the summing coefficients of the Chebyshev polynomials $C_3$ and $C_1$ need to be selected with reasonable accuracy, whereas those of the other terms can be selected with reduced proportional accuracy because their contribution to the summed signal is small. Furthermore, any undesirable departure from true Chebyshev form in the generation of the Chebyshev-like polynomials will have a smaller effect upon errors in V(T) than corresponding errors used in generating a straight $(T-T_0)^n$ expansion since part of the summation of the polynomials to generate V(T) has already been done. Overall, by using Chebyshev-like polynomials (i.e. polynomials in which the excursion over the required temperature range is close to a minimum), the accuracy to which the polynomials themselves are generated, and the accuracy to which their weighted sum is formed to provide V(T), can be reduced. The magnitudes of the individual summing coefficients required to be used to form the weighted sum are calculated by using a standard linear regression technique upon the measured values of the Chebyshev-like curves generated by a power series function generator and of the required V(T) at selected points in the required working temperature range.

Figure 3:
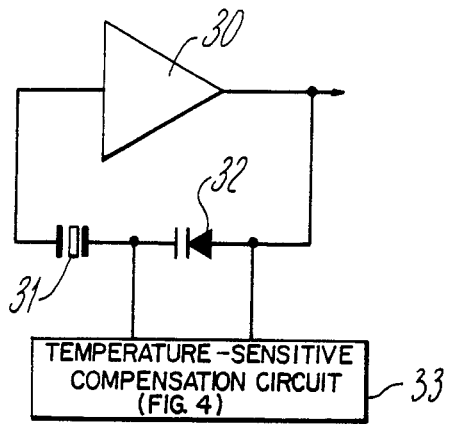
FIG. 3 is a basic block diagram of a temperature controlled crystal oscillator arrangement according to the present invention.

FIG. 3 depicts a basic block diagram of the oscillator arrangement. The oscillator arrangement consists of an oscillator circuit 30, 31, 32 and a temperature sensitive compensation circuit 33. The oscillator circuit includes an amplifier 30 having a frequency selective positive feedback path incorporating a crystal 31 and a varactor diode 32. The temperature sensitive compensation circuit 33 is instituted by a compensation network which provides a d.c. voltage output V(T) across the varactor diode 32 that exhibits the appropriate function of temperature to force the frequency of oscillation in such a way as to hold it within required limits over the desired working temperature range. This compensation network 33 is shown in greater detail in the block diagram of FIG. 4.

Figure 4:
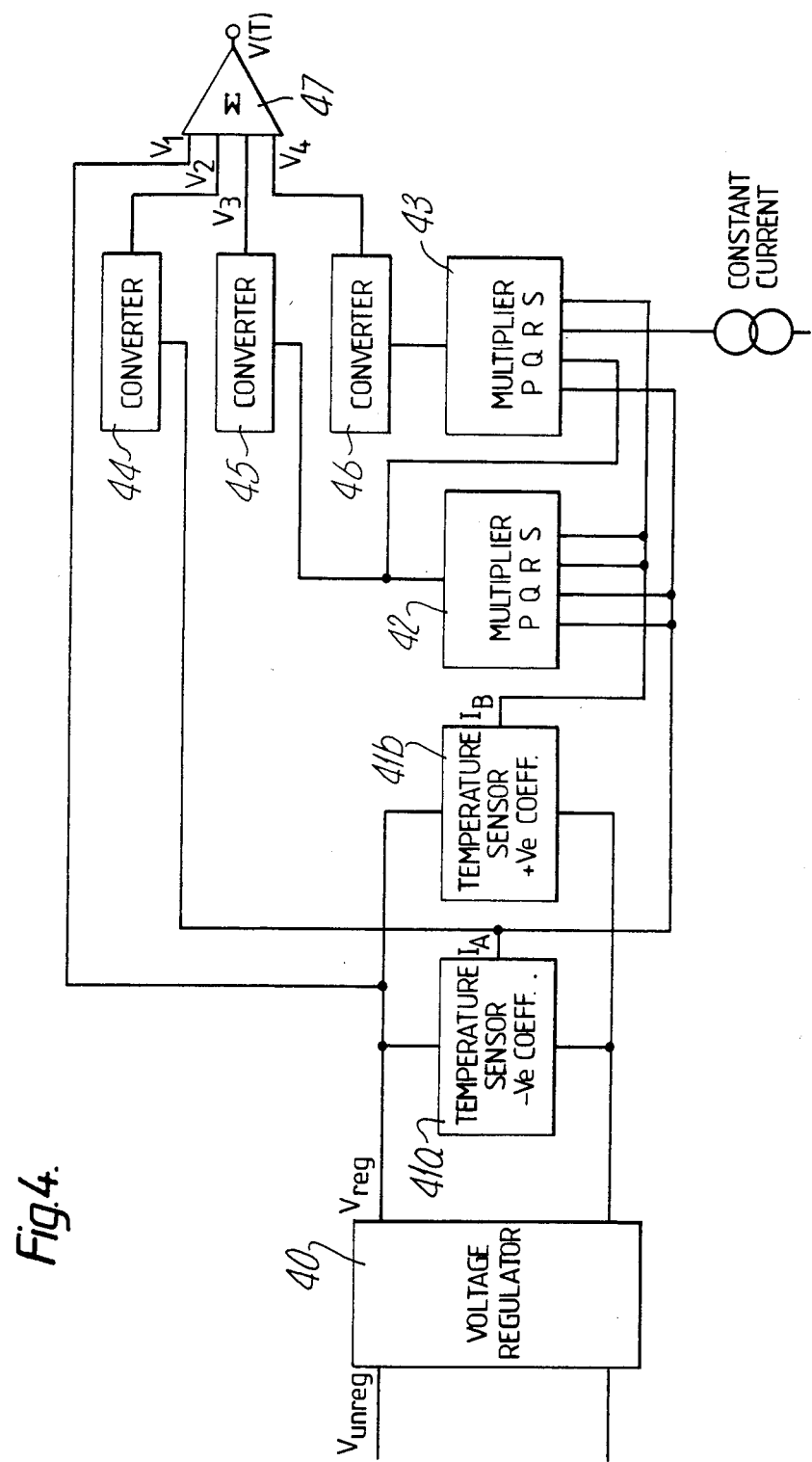
FIG. 4 is a more detailed block diagram of a compensation network for use in the arrangement of FIG. 3.

Referring now to FIG. 4, it may be seen that the compensation network 33 consists essentially of a voltage regulator or reference 40, a two-part temperature sensor 41a and 41b, a power series function generator including two analog multipliers 42 and 43 and three current-to-voltage signal converters 44, 45 and 46, and a summing amplifier 47. With the exception of a number of resistors that are difficult to implement adequately in integrated circuit form, all the components of the compensation network are advantageously formed in a single integrated circuit.

The preferred way of implementing the power series function generator 42 to 46 and a summing amplifier 47 of the compensation network is by means of an integrated circuit. Under these circumstances it is clearly attractive to employ the same integrated circuit for the construction of the temperature sensor 41a and 41b. A particularly convenient way of achieving this end is to make use of the substantially linear temperature dependence of the base-emitter voltage of integrated circuit transistors. In this particular embodiment this effect is used to provide a sensor having two parts 41a and 41b, one producing an output current $I_A$ with a negative temperature coefficient, and the other producing an output current $I_B$ with an equal but opposite positive temperature coefficient.

It is also convenient to use another part of the same integrated circuit to provide the varactor diode 32 and the rest of the oscillator circuit 30 to 32 with the exception of the crystal 31 itself. In some circumstances a separate varactor diode 32 may be preferred because of the greater voltage swing then obtainable. Finally a further part of the same integrated circuit is conveniently used to provide the voltage regulator or reference 40. This integrated circuit is conveniently a semi-custom design analog array integrated circuit. Typically, if the power series function generator 42 to 46 is required to generate more than three terms, then more than one such array may be required to accommodate all the circuitry.

Figure 5:
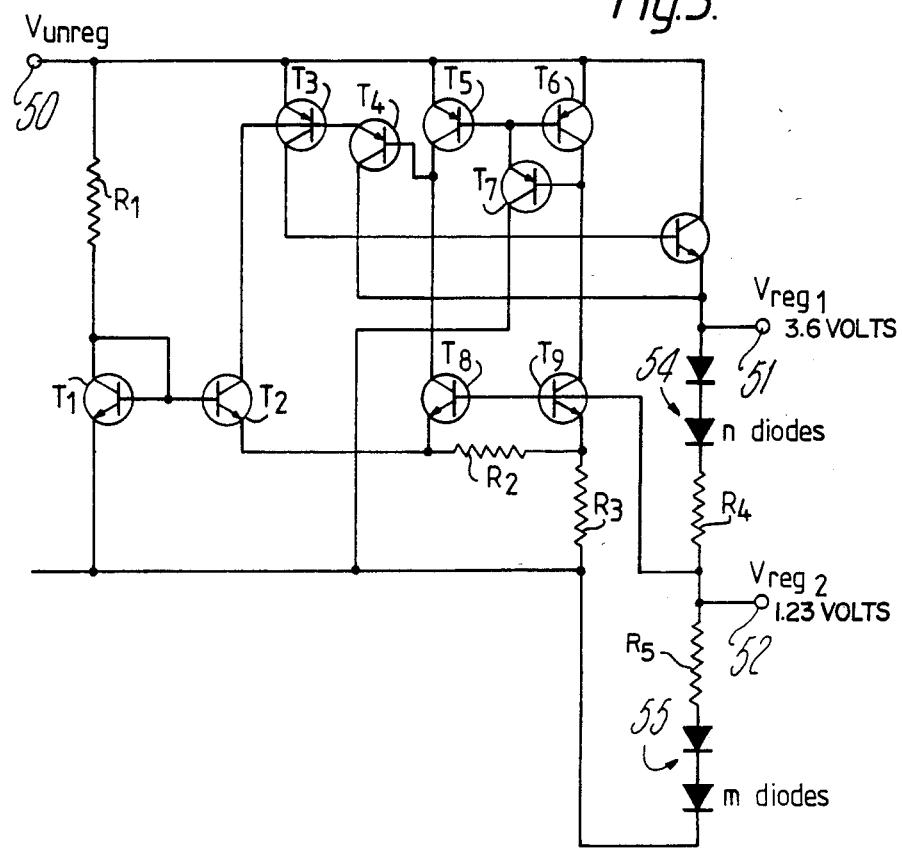
FIG. 5 is a circuit diagram of a voltage regulator for use in the compensation network of FIG. 4.

The circuit diagram of the voltage reference or regulator 40 is depicted in FIG. 5. This circuit has an unregulated voltage input 50 and first and second reference voltage outputs 51 and 52. It uses a standard band-gap circuit to generate a constant voltage at the base of a transistor $T_9$. Transistors $T_8$ and $T_9$ are chosen so that they operate at different current densities in order to develop a positive temperature coefficient voltage across a resistor $R_2$. This coefficient is scaled up by the resistor ratio $R_3:R_2$, and is added to the negative temperature coefficient of the base-emitter voltage of transistor $T_9$ to provide a zero temperature coefficient output $V_{reg2}$ of about 1.23 volts which is supplied to terminal 52. A resistor $R_1$ and transistors $T_1$ and $T_2$ constitute a startup circuit for the voltage regulator circuit, while a Darlington transistor pair $T_3$ and $T_4$ operates to minimize the drop out voltage and instability in the voltage regulator circuit. The constant voltage at the base of the transistor $T_9$ is scaled up by resistor-diode networks 54 and 55. The scale factor is a rational fraction $k=n/m=R_4/R_5$ where n and m are the numbers of diodes in the respective networks 54 and 55. Typically the scale factor is 2:1, giving a reference voltage output at 51 of about 3.6 volts.

Figure 6:
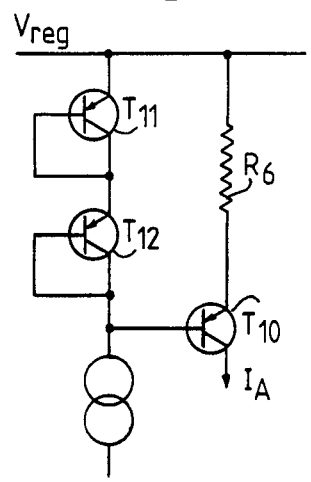
FIGS. 6 and 7 are basic circuit diagrams of two parts of a temperature sensor of the compensation network of FIG. 4 which respectively generate negative and positive temperature coefficient currents.

The temperature sensor 41a of FIG. 4 includes a current source with a substantially linear negative temperature coefficient which can be provided by a single circuit of the type depicted in FIG. 6. Here the sum of the voltage drop across the base emitter junction of a transistor $T_{10}$ and that across a resistor $R_6$ is equal to the sum of the voltage drops across the base-emitter junctions of two transistors $T_{11}$ and $T_{12}$ each having its base shorted to its collector so that it functions as a diode. Therefore $$V_{BE} + I_A R_{10} = 2V_{BE}.$$

$V_{BE}$ has a negative temperature coefficient and therefore $I_A$ will also have a negative temperature coefficient. Reverting attention to the voltage regulator circuit diagram of FIG. 5, it can be seen that the top two diodes of the resistor diode network 54 can also function as the diodes of the circuit of FIG. 6.

Figure 7:
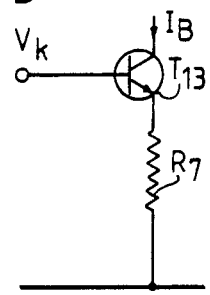

The temperature sensor 41b of FIG. 4 includes a complementary current source with a substantially linear positive temperature coefficient that can be provided by a simple circuit of the type depicted in FIG. 7. A constant voltage $V_K$ applied to the base of a transistor $T_{13}$ provides a collector current $I_B$ satisfying the relationship $$V_K = I_B R_7 + V_{BE}$$

$V_{BE}$ has a negative temperature coefficient and hence $I_B$ has a positive temperature coefficient.

The circuits of FIGS. 6 and 7 thus provide the two parts of the temperature sensor of FIG. 4.

Figure 8:
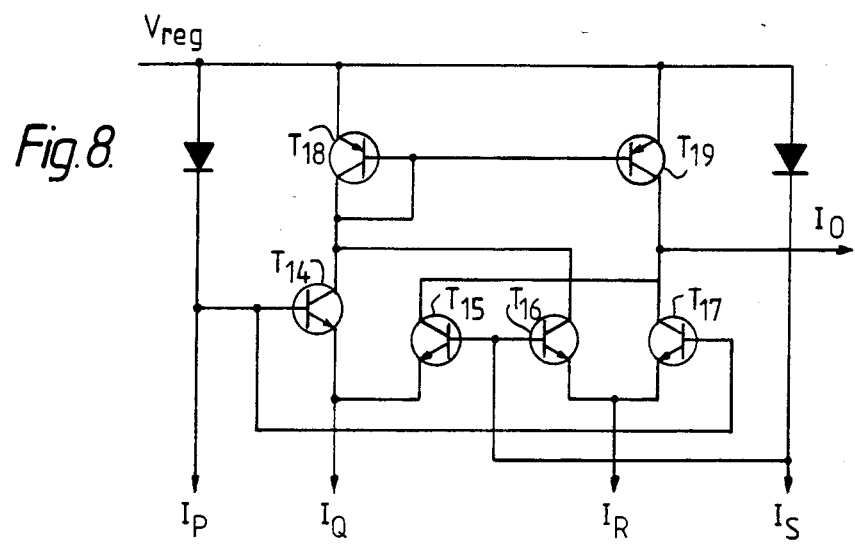
FIGS. 8 and 9 are circuit diagrams of analog multiplier and current-to-voltage converter elements, respectively, for use in the compensation network of FIG. 4.

Each of the two analog multipliers 42 and 43 of FIG. 4 is advantageously provided by a circuit as depicted in the circuit diagram of FIG. 8. Transistors $T_{14}$, $T_{15}$, $T_{16}$ and $T_{17}$ form a cross coupled analog multiplier structure provided with an active load by transistors $T_{18}$ and $T_{19}$. For currents $I_P$, $I_Q$, $I_R$ and $I_S$ the output current $I_0$ can readily be shown to satisfy the relationship $$I_0 = (I_P - I_S)(I_Q - I_R)/(I_P + I_S)$$

Inspection of this relationship shows that the output current $I_0$ will have a quadratic dependence upon temperature by making $I_P = I_Q = I_A$ and $I_R = I_S = I_B$. This gives the required relationship for $I_2$, the output current of the multiplier 42. $I_2$ is thus given by $$I_2 = (I_A - I_B)^2/(I_A + I_B).$$

$(I_A + I_B)$ is temperature invariant, and hence $I_2$ has a simple square law dependence upon temperature.

For the multiplier 43, $I_P = I_A$ and $I_S = I_B$ to give a temperature invariant divisor in the multiplier equation, while $$I_Q = I_2 + I_{C1} \text{ and } I_R = I_{C2}$$

where $I_{C1}$ and $I_{C2}$ are temperature invariant currents.

$I_3$, the output of the multiplier 43, thus satisfies the relationship $$I_3 = \{I_A - I_B\}\{(I_A - I_B)^2 + (I_{C1} - I_{C2})(I_A + I_B)\}/(I_A + I_B)^2$$

Remembering that $(I_A + I_B)$, $I_{C1}$ and $I_{C2}$ are all constant terms, it is seen that $I_3$ has a temperature dependence, provided by the sum of a cubic term and a linear term, whose relative magnitude is made close to that of the minimum excursion form of the Chebyshev polynomial $C_3$ by the appropriate choice of values for $I_{C1}$ and $I_{C2}$.

Figure 9:
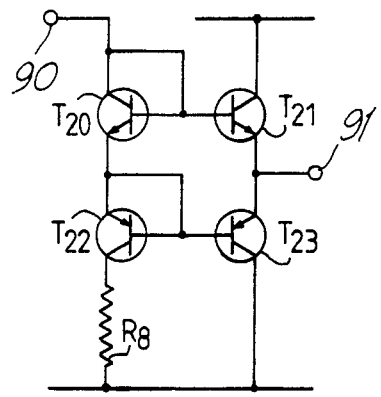

The basic structure of each of the current-to-voltage converters 44, 45 and 46 of FIG. 4 is given by the circuit diagram of FIG. 9. Each converter has a current input at 90 and a voltage output at 91. It will be noted, however, that this converter 44, 45, or 46 requires a unidirectional current to be applied to its current input 90. The input to the converter 44 is $I_A$ which is unidirectional. The output current $I_2$ is also unidirectional, but the temperature invariant current $I_{C2}$ is added to give a constant component to the output voltage V3 and reduces the coefficient $A_0$ in the summing amplifier 47. The output current $I_3$ of the multiplier 43 is bidirectional and the previously referred-to temperature invariant current $I_{C3}$ is used as an offset current and added to $I_3$ to provide the requisite unidirectional current input to the converter 46.

Figure 10:
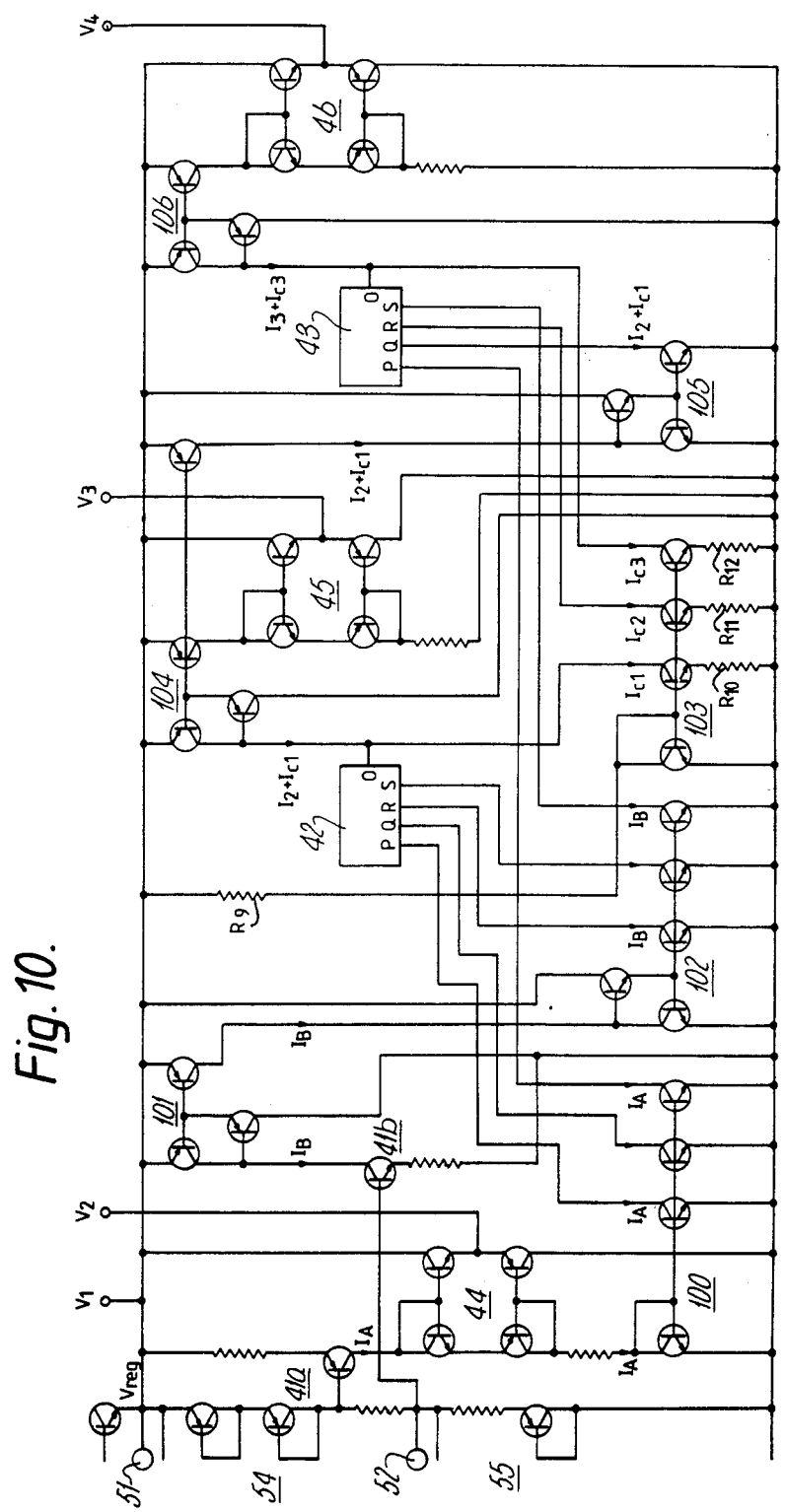
FIG. 10 is a circuit diagram showing the interconnection of the circuit elements of FIGS. 6, 7, 8 and 9.

Current mirrors are employed to create images and duplicates of the various currents in the power series generator 42 to 46 as required. These are illustrated in the circuit diagram of FIG. 10. FIG. 10 shows the resistor diode networks of a circuitry of the voltage reference 40 that has two diodes in the network 54 and a single diode in the network 55. The two diodes of the network 54 also function as the two diodes of the negative temperature coefficient current generator 41a. The output of this generator 41a is fed directly to the current-to-voltage converter 44, which has an extra diode inserted between its resistor and the negative rail. This diode forms part of a multiple current mirror 100.

The constant voltage source for the positive temperature coefficient current generator 41b is taken from the second reference voltage appearing at 52. This current is reflected in a current mirror 101, and further reflected in a multiple current mirror 102.

A further multiple current mirror 103 is used to provide the requisite constant currents $I_{C1}$, $I_{C2}$ and $I_{C3}$, whose magnitudes are determined by the relative values of the resistors $R_9$, $R_{10}$, $R_{11}$ and $R_{12}$.

The output current of the multiplier 42 is suitably offset by the constant current $I_{C1}$ to provide a unidirectional current $(I_2 + I_{C1})$ which is reflected in a multiple current mirror 104. One reflection is fed to the current-to-voltage converter 45, while the other reflection is taken to a current mirror 105 for the 'Q' terminal of the multiplier 43. Similarly the output current of the multiplier 43 is suitably offset by the constant current $I_{C3}$ to provide a unidirectional current $(I_3+I_{C3})$ for feeding to the current-to-voltage converter 46 via a current mirror 106.

Figure 11:
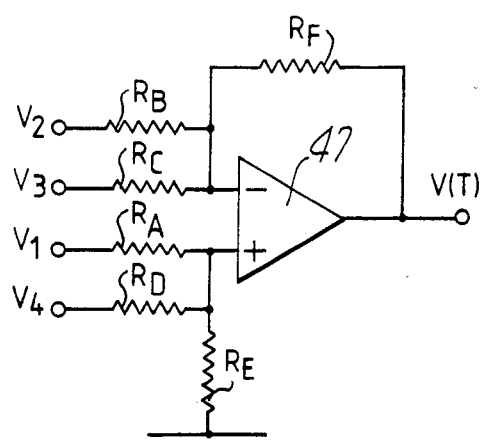
FIG. 11 is a diagram of a summing amplifier for use in the compensating network of FIG. 4.

Referring now to FIG. 11, the voltage outputs $V_1$ to $V_4$ are fed to the summing amplifier 47, which is a differential amplifier, via a resistor network comprising resistors $R_A$ to $R_F$. Positive coefficients are fed to the non-inverting input of the differential amplifier 47 while negative coefficients are fed to the inverting input. Thus FIG. 11 shows the arrangement where the first and fourth outputs $V_1$ and $V_4$ of the power series function generator are required to be positive, while the second and third outputs $V_2$ and $V_3$ are negative. The control signal output for driving the control element, that is the varactor diode 32, in the oscillator feedback path, is in this instance given by $$V(T)=(R_F/R_A)V_1-(R_F/R_B)V_2-(R_F/R_C)V_3+(R_F/R_D)V_4$$

where $R_E$ satisfies the relationship $$1/R_E=1/R_F+1/R_B+1/R_C-1/R_A-1R/_D$$

These resistors $R_A$ to $R_F$ providing the weighting coefficients are discrete off-chip resistors, but it is found that the coefficients can be adequately represented using 2% accuracy E24 series resistors (resistors having 24 preferred values per decade) over 4 decades rather than the 1% accuracy E96 series resistors required for the three thermistor resistor temperature compensation ladder network of the prior art. Discrete off-chip resistors are also required for resistors $R_6$ and $R_7$ used in generating the negative and positive temperature coefficient current outputs of the temperature sensor 41a, 41b. It is also convenient to use discrete off-chip resistors for the resistor $R_1$ of the voltage reference 40 (though an on-chip resistor can be used here because the tolerance is not critical) and the resistor $R_9$ feeding current mirror 103 which provides the offset currents $I_{C1}$, $I_{C2}$ and $I_{C3}$.

In the case of a temperature compensated oscillator requiring the use of more than four terms in the power series expansion, the fifth term is generated by a third analog multiplier (not shown) feeding a further current to voltage converter (not shown). The arrangement inputs to the multiplier are similar to those of the multiplier 43, thus the P and S terminals are provided with currents $I_A$ and $I_B$ respectively, the terminal R is provided with a constant current $I_{C4}$, and the terminal Q is provided with a current derived from the previous multiplier 46 via an additional current mirror. The output of the further multiplier is similarly offset by a further constant current $I_{C5}$ and fed via a current mirror (not shown) to its associated current to voltage converter (not shown). Succeeding stages, if required, are similarly connected in cascade.

Conversely if few stages are required, such as may be the case for oscillators requiring stabilization over the more restricted temperature range from 0° to 70° C., some of the later stages can be omitted. Thus an appropriately oriented AT-cut crystal can typically be adequately temperature compensated over the 0° to 70° C. range using only $V_1$ and $V_2$, the constant and linearly temperature dependent terms of the power series expansion.

It should also be clearly understood that the invention is applicable to temperature compensation of other types of cut of crystal. For instance, the BT-cut can be used which would, however, require a much larger square law coefficient than that encountered in AT-cut crystals.

While we have described above the principles of our invention in connection with specific apparatus it is to be clearly understood that this description is made only by way of example and not as a limitation to the scope of our invention as set forth in the objects thereof and in the accompanying claims.

We claim:

1. A temperature compensated crystal oscillator arrangement, comprising
   a crystal oscillator circuit including an oscillator crystal and having a frequency selective positive feedback path incorporating a frequency pulling control element; and
   a temperature sensitive compensation circuit so connected to said feedback path as to drive said control element and including
   temperature sensing means operative for issuing an electrical output signal that is a monotonically varying function of temperature,
   power series function generator means connected to said temperature sensing means to receive said output signal therefrom and operative for generating a series of outputs that represent the terms of a Chebyshev-like polynomial function, the orders of the terms increasing from zero to the number of outputs less one,
   summing amplifier means having a plurality of inputs each receiving one of said outputs of said power series function generator means and operative for providing an output signal that is a weighted sum of said outputs of said power series function generator means, and
   means for applying said output of said summing amplifier means to said feedback path so as to drive said control element.

2. The oscillator arrangement as defined in claim 1, wherein said power series function generator means is operative for generating a series of at least three of said outputs.

3. The oscillator arrangement as defined in claim 2, wherein said crystal is an AT-cut crystal.

4. The oscillator arrangement as defined in claim 3, wherein the angle of the cut of said crystal is chosen to provide substantially minimum excursion of natural resonant frequency over the working temperature range, and wherein the third of said series of outputs of said power series function generator means has a minimum excursion form approximating the Chebyshev polynomial term $C_3$.

5. The oscillator arrangement as defined in claim 1, wherein said temperature sensing means, said power series function generator means and said summing amplifier means include active components that are provided on at least one integrated circuit.

6. The oscillator arrangement as defined in claim 5, wherein said at least one integrated circuit is provided by a semicustom analog array.

7. The oscillator arrangement as defined in claim 5, wherein said integrated circuit includes a voltage reference.

8. The oscillator arrangement as defined in claim 5, wherein said integrated circuit includes said frequency pulling control element of said oscillator circuit.

9. The oscillator arrangement as defined in claim 5, wherein the only components not part of said at least one integrated circuit are resistors.

10. The oscillator arrangement as defined in claim 9, wherein said resistors are 2% accuracy E 24 series resistors.

11. The oscillator arrangement as defined in claim 5, wherein said at least one integrated circuit includes said oscillator circuit with the exception of said frequency pulling control element and said crystal.

12. The oscillator arrangement as defined in claim 5, wherein said integrated circuit includes said oscillator circuit with the exception of said crystal.

13. The oscillator arrangement as defined in claim 5, wherein the only discrete off-chip components of said integrated circuit are resistors and said crystal.

14. A temperature compensated crystal oscillator arrangement, comprising:
- a crystal oscillator circuit including an oscillator crystal and having a frequency selective positive feedback path incorporating a frequency pulling control element;
- a temperature sensitive compensation circuit so connected to said feedback path as to drive said control element and including:
  - temperature sensing means operative for issuing an electrical output signal that is a monotonically varying function of temperature;
  - power series function generator means connected to said temperature sensing means to receive said output signal therefrom and operative for generating a series of outputs that represent the terms of a polynomial function, the orders of the terms increasing from zero to the number of outputs less one;
  - summing amplifier means having a plurality of inputs each receiving one of said outputs of said power series function generator means and operative for providing an output signal that is a weighted sum of said outputs of said power series function generator means; and
  - means for applying said output of said summing amplifier means to said feedback path so as to drive said control elements;
- said temperature sensing means, said power series function generator means and said summing amplifier means including active components that are provided on at least one integrated circuit; and
- said temperature sensing means including circuitry adapted to provide first and second substantially linear temperature coefficient current output signals whose coefficients are respectively positive and negative with the modulus of the first coefficient being substantially equal to that of the second, both signals being derived from the temperature characteristic of the base emitter voltages of elements of the at least one integrated circuit.

15. An oscillator as claimed in claim 1, wherein said frequency pulling control element is a varicap diode.

* * * * *